(12) United States Patent
Takahara et al.

(10) Patent No.: US 12,280,952 B2
(45) Date of Patent: Apr. 22, 2025

(54) TRANSFER SYSTEM

(71) Applicant: DAIFUKU CO., LTD., Osaka (JP)

(72) Inventors: Fumio Takahara, Komaki (JP); Shinichiro Higashi, Komaki (JP); Rina Ishii, Komaki (JP)

(73) Assignee: DAIFUKU CO., LTD., Osaka (JP)

( * ) Notice: Subject to any disclaimer, the term of this patent is extended or adjusted under 35 U.S.C. 154(b) by 745 days.

(21) Appl. No.: 17/667,596

(22) Filed: Feb. 9, 2022

(65) Prior Publication Data

US 2022/0267093 A1    Aug. 25, 2022

(30) Foreign Application Priority Data

Feb. 19, 2021    (JP) .................................. 2021-024732

(51) Int. Cl.
*B65G 1/137*    (2006.01)

(52) U.S. Cl.
CPC .................................. *B65G 1/1373* (2013.01)

(58) Field of Classification Search
CPC ............... B65G 1/1373; B65G 1/0457; B65G 2201/0297; H01L 21/67389; H01L 21/67736; H01L 21/67769; H01L 21/67733; H01L 21/67017; H01L 21/67184; H01L 21/67706; H01L 21/67742; H01L 21/6773
See application file for complete search history.

(56) References Cited

U.S. PATENT DOCUMENTS

| | | | |
|---|---|---|---|
| 9,171,734 B1 * | 10/2015 | Toyoda | H01L 21/02274 |
| 11,787,630 B2 * | 10/2023 | Takahara | H01L 21/67736 |
| | | | 414/281 |
| 2017/0278736 A1 | 9/2017 | Iwasaki | |

FOREIGN PATENT DOCUMENTS

| | | | | |
|---|---|---|---|---|
| EP | 3343597 B1 * | 4/2022 | | B65G 1/14 |
| JP | 2007-96140 A | 4/2007 | | |
| JP | 2009-158627 A | 7/2009 | | |
| JP | 2014110299 A * | 6/2014 | | |
| KR | 20090086163 A * | 8/2009 | | |
| KR | 20190088023 A * | 7/2019 | | |
| WO | WO2016/047260 A1 | 3/2016 | | |

OTHER PUBLICATIONS

Notice of Reasons for Refusal (with English translation) dated Apr. 25, 2023 from related/corresponding Japanese Patent Application No. 2021-024732.
Notice of Reasons for Refusal (with English translation) drafted on Apr. 18, 2023 (received Apr. 25, 2023) from related/corresponding Japanese Patent Application No. 2021-024732.

* cited by examiner

*Primary Examiner* — Jacob S. Scott
*Assistant Examiner* — Erin Morris
(74) *Attorney, Agent, or Firm* — RENNER, OTTO, BOISSELLE & SKLAR, LLP

(57) ABSTRACT

A transfer system includes a ceiling carrier, a ceiling storage shelf, and a purging device. The ceiling carrier transfers a foup along a running rail. The ceiling storage shelf is provided along the running rail. The ceiling storage shelf stores the foup transferred by the ceiling carrier. The purging device purges the foup stored in the ceiling storage shelf. The ceiling storage shelf includes placement portions and for placing the foup thereon. The placement portions and can be moved with respect to a storage shelf body of the ceiling storage shelf by a driving gas supplied to the purging device.

7 Claims, 4 Drawing Sheets

F I G. 4
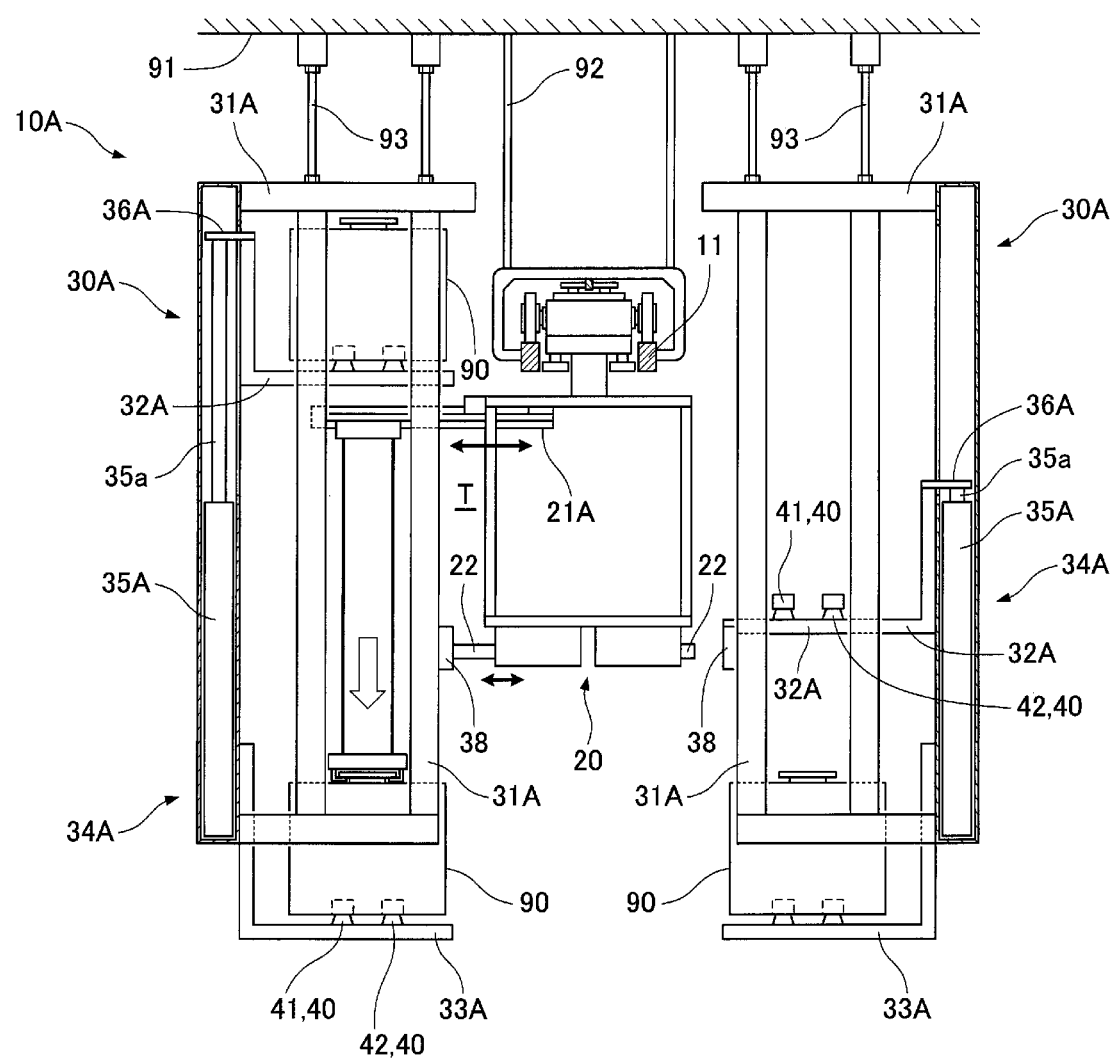

TRANSFER SYSTEM

FIELD OF THE INVENTION

The present invention relates to a transfer system including a carrier transferring a container along a transfer path, and a storage shelf provided along the transfer path and storing the container transferred by the carrier.

BACKGROUND OF THE INVENTION

Conventionally, as this type of transfer system, there is a transfer system as shown in Japanese Patent Laid-Open No. 2007-96140. The transfer system in Japanese Patent Laid-Open No. 2007-96140 includes a carrier running along an in-process annular track (transfer path) provided on a ceiling of a building to transfer a foup (container), and a suspended shelf device (storage shelf) suspended from the ceiling and temporarily placing the foup transferred by the carrier thereon.

In the transfer system in Japanese Patent Laid-Open No. 2007-96140, the suspended shelf device includes two upper and lower slide plates (placement portions), a gear for sliding these slide plates, and a motor provided with a reducer and driving the gear. Further, after sliding of either one of the upper and lower slide plates is completed, the carrier places the foup on the slide plate by moving the foup downward with a lifting belt. In the transfer system in Japanese Patent Laid-Open No. 2007-96140, the motor for moving the slide plates is provided for each suspended shelf device, and the slide plates are moved by driving the motor.

Additionally, the transfer system as shown in Japanese Patent Laid-Open No. 2007-96140 may be provided with a purging device for purging the container stored in the storage shelf with a purging gas such as $N_2$ gas. Especially, in the transfer system provided in a semiconductor factory or the like, in order to suppress oxidization and the like of the surfaces of semiconductor substrates, the purging device for purging the container housing the semiconductor substrates by the purging gas is provided in the storage shelf storing the container.

However, when the purging devices as described above is provided in a transfer system that moves the placement portions by driving the motor as in the transfer system in Japanese Patent Laid-Open No. 2007-96140, it is necessary to provide two types of supplying system, i.e., a power supply system for supplying power to the motor, and a gas supplying system for supplying a gas such as a purging gas to the purging device. Accordingly, there is a problem that the transfer system itself becomes complicated.

SUMMARY OF THE INVENTION

In order to solve the problem described above, an object of the present invention is to provide a transfer system that can install a mechanism for moving placement portions of a storage shelf, and a purging device for purging a container stored in the storage shelf with a simple system configuration.

In order to solve the problem described above, a transfer system of the present invention includes a carrier transferring a container along a transfer path, a storage shelf provided along the transfer path and storing the container transferred by the carrier, and a purging device purging the container stored in the storage shelf, wherein the storage shelf includes a placement portion for placing the container thereon, and the placement portion can be moved with respect to a main body portion of the storage shelf by a gas supplied to the purging device.

In this configuration, purging of the container stored in the storage shelf, and movement of the placement portion with respect to the main body portion of the storage shelf are performed by the gas supplied to the purging device.

In the transfer system of the present invention, the placement portion can be moved up and down with respect to the main body portion of the storage shelf by the gas supplied to the purging device.

In this configuration, the placement portion is moved up and down with respect to the main body portion of the storage shelf by the gas supplied to the purging device.

In the transfer system of the present invention, the placement portion can be horizontally moved with respect to the main body portion of the storage shelf by the gas supplied to the purging device.

In this configuration, the placement portion is horizontally moved with respect to the main body portion of the storage shelf by the gas supplied to the purging device.

In the transfer system of the present invention, the gas supplied to the purging device includes a purging gas for purging the container, and a flow rate controlling gas for adjusting the flow rate of the purging gas, and the placement portion can be moved with respect to the main body portion of the storage shelf by the purging gas.

In this configuration, the placement portion is moved with respect to the main body portion of the storage shelf by the purging gas.

In the transfer system of the present invention, the gas supplied to the purging device includes a purging gas for purging the container, and a flow rate controlling gas for adjusting the flow rate of the purging gas, and the placement portion can be moved with respect to the main body portion of the storage shelf by the flow rate controlling gas.

In this configuration, the placement portion is moved with respect to the main body portion of the storage shelf by the flow rate controlling gas.

The transfer system of the present invention includes a drive mechanism for moving the placement portion with respect to the main body portion of the storage shelf, wherein the placement portion can be moved with respect to the main body portion of the storage shelf, when the gas supplied to the purging device is started to be supplied to the drive mechanism by the carrier.

In this configuration, the placement portion can be moved with respect to the main body portion of the storage shelf, when the carrier starts supplying, to the drive mechanism, the gas supplied to the purging device According to the transfer system of the present invention, the placement portion is moved with respect to the main body portion of the storage shelf by the gas supplied to the purging device. Thus, it is unnecessary to provide a power supply system for moving the placement portion. Therefore, the mechanism for moving the placement portion of the storage shelf, and the purging device for purging the container can be installed with a simple system configuration.

BRIEF DESCRIPTION OF THE DRAWINGS

FIG. 4 is a front view in a case where an upper placement portion is moved up in the transfer system.

DETAILED DESCRIPTION OF THE INVENTION

First, a transfer system 10 according to the present invention will be described.

Figure 1:
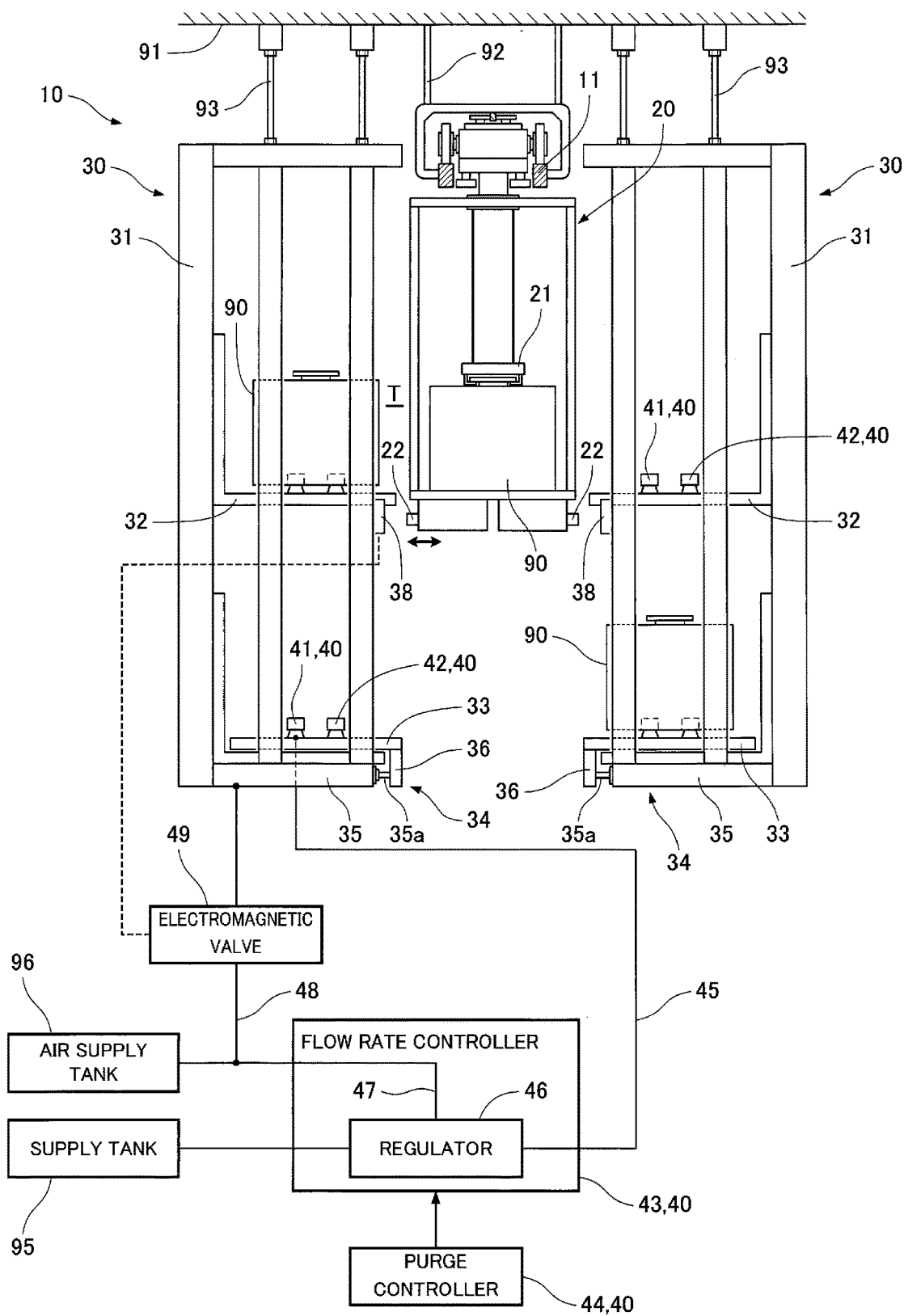
FIG. 1 is a front view of a transfer system according to an embodiment of the present invention.

The transfer system 10 is provided in, for example, a clean room in a semiconductor substrate manufacturing factory and the like. The transfer system 10 is a system for transferring a foup 90 (an example of "a container") housing semiconductor substrates. The transfer system 10 transfers the foup 90 among a plurality of processing devices that process semiconductor substrates. As shown in FIG. 1, the transfer system 10 mainly includes a running rail 11, which is a transfer path, a ceiling carrier 20 (an example of "a carrier") that runs along the running rail 11, a ceiling storage shelf 30 (an example of "a storage shelf") provided along the running rail 11, and a purging device 40 for purging the foup 90 stored in the ceiling storage shelf 30.

The running rail 11 is provided above the plurality of processing devices (not shown), and on the ceiling 91 side. The running rail 11 is supported from the ceiling 91 by volts 92 or the like.

The ceiling carrier 20 transfers the foup 90 housing the semiconductor substrates along the running rail 11. The ceiling carrier 20 is attached to the running rail 11 in a suspended state, and runs along the running rail 11. The ceiling carrier 20 stops in front of the ceiling storage shelf 30 on which the foup 90 should be placed (the position where the foup 90 is transferred, hereinafter referred to as the transfer position T for the foup 90), and transfers the foup 90 to the ceiling storage shelf 30. The ceiling carrier 20 includes a transfer device 21 that holds the foup 90 and is movable horizontally or vertically.

The ceiling carrier 20 includes a pair of pushers 22 in its lower portion. The pushers 22 are rod-shaped protrusions that move while protruding in the direction horizontally perpendicular to the traveling direction of the ceiling carrier 20. The pushers 22 can be extended and retracted with respect to the ceiling carrier 20. When the ceiling carrier 20 stops at the transfer position T for the foup 90, the pushers 22 protrude horizontally, so as to be provided at positions at which a mechanical valve 38 provided in a front surface side (the side from which the foup 90 is transferred in and out) of the ceiling storage shelf 30 can be pressed. The pushers 22 can horizontally protrude in both left and right sides with respect to the traveling direction of the ceiling carrier 20.

The ceiling storage shelf 30 temporarily stores the foup 90 transferred by the ceiling carrier 20. The foup 90 is transferred between the ceiling storage shelf 30 and the ceiling carriers 20 at the transfer position T for the foup 90. In the transfer system 10, a plurality of ceiling storage shelves 30 are disposed to be arranged along the running rail 11. The ceiling storage shelves 30 are provided on both left and right sides of the running rail 11 so as to face each other across the running rail 11 as shown in FIG. 1, or the ceiling storage shelves 30 are provided on either one side of the left and right sides of the running rail 11. The ceiling storage shelves 30 are held in a suspended state from the ceiling 91 with volts 93 or the like.

As shown in FIG. 1, the ceiling storage shelf 30 includes a storage shelf body 31 (an example of "a main body portion of a storage shelf"), a plurality of placement portions 32 and 33 for placing the foup 90 thereon, and a drive mechanism 34 for horizontally moving the lower placement portion 33.

The storage shelf body 31 is a frame that extends in the vertical direction. The storage shelf body 31 is held in a suspended state from the ceiling 91 with the volts 93 or the like. The storage shelf body 31 holds the placement portions 32 and 33 with a predetermined interval in the vertical direction.

The upper placement portion 32 and the lower placement portion 33 are plates on which the foup 90 can be placed. The upper placement portion 32 and the lower placement portion 33 are disposed in the storage shelf body 31 at the predetermined interval in the vertical direction, and two foups 90 can be disposed on the upper and lower portions.

The upper placement portion 32 is a fixed receiving rack fixed to the storage shelf body 31. The upper placement portion 32 is disposed at a position where the foup 90 horizontally transferred from the ceiling carrier 20 at the transfer position T for the foup 90 can be received.

The lower placement portion 33 is a movable receiving rack horizontally movable with respect to the storage shelf body 31. In the ceiling storage shelf 30, at the position where the ceiling carrier 20 is stopped, i.e., the transfer position T for the foup 90, the foup 90 is transferred between the ceiling carrier 20 and the lower placement portion 33 by moving the foup 90 up and down by the transfer device 21 of the ceiling carrier 20. Therefore, the lower placement portion 33 horizontally moves from the storage shelf body 31 to directly below the ceiling carrier 20 stopped at the transfer position T for the foup 90. The lower placement portion 33 is horizontally moved by the drive mechanism 34.

The drive mechanism 34 extends horizontally in the lower part of the lower placement portion 33. The drive mechanism 34 is mainly composed of an air cylinder 35, and a block 36 moved by extension and contraction of a rod 35a of the air cylinder 35. The air cylinder 35 is provided so that the rod 35a can be horizontally extended and contracted. The block 36 is connected to a tip of the rod 35a. The block 36 moves horizontally when the rod 35a is extended and contracted. The block 36 is connected to the lower placement portion 33. In the drive mechanism 34, when the block 36 moves horizontally, the lower placement portion 33 moves horizontally with respect to the storage shelf body 31.

The purging device 40 is a device for purging the inside of the foup 90 with a predetermined purging gas (for example, an inert gas such as $N_2$). The purging device 40 is disposed below the placement portions 32 and 33. The purging device 40 purges the foup 90 placed on the placement portions 32 and 33. The purging device 40 mainly includes a purge nozzle 41, an exhaust nozzle 42, a flow rate controller 43, and a purge controller 44.

The purge nozzle 41 and the exhaust nozzle 42 are disposed to be connectable to a gas inlet port and a gas exhaust port of the foup 90, when the foup 90 is placed on the placement portion 32, 33. The purge nozzle 41 is connected to a pipe 45, and is further connected to a supply tank 95 for the purging gas via the flow rate controller 43. The exhaust nozzle 42 is connected to an exhaust path (not shown) for the purging gas.

The flow rate controller 43 controls the flow rate of the purging gas in the pipe 45 connected to the foup 90 (a flow path between the gas inlet port of the foup 90 and the supply tank 95). The flow rate controller 43 mainly includes a regulator 46 and an air pipe 47. The regulator 46 is for adjusting the pressure of the purging gas. The air pipe 47 is for circulating a driving air (an example of "a flow controlling gas") for driving the regulator 46. Since the flow rate controller 43 controls the flow rate of the purging gas in the pipe 45, the flow rate of the purging gas supplied from the supply tank 95 for the purging gas to the purge nozzle 41 is controlled. The flow rate controller 43 is communicatively connected to the purge controller 44. The flow rate controller 43 controls the flow rate of the purging gas by controlling the regulator 46 with a control signal from the purge controller 44. The air pipe 47 is connected to an air supply tank 96. The air pipe 47 supplies the driving air to the regulator 46.

Next, the horizontal movement of the lower placement portion 33 will be described.

Figure 2:
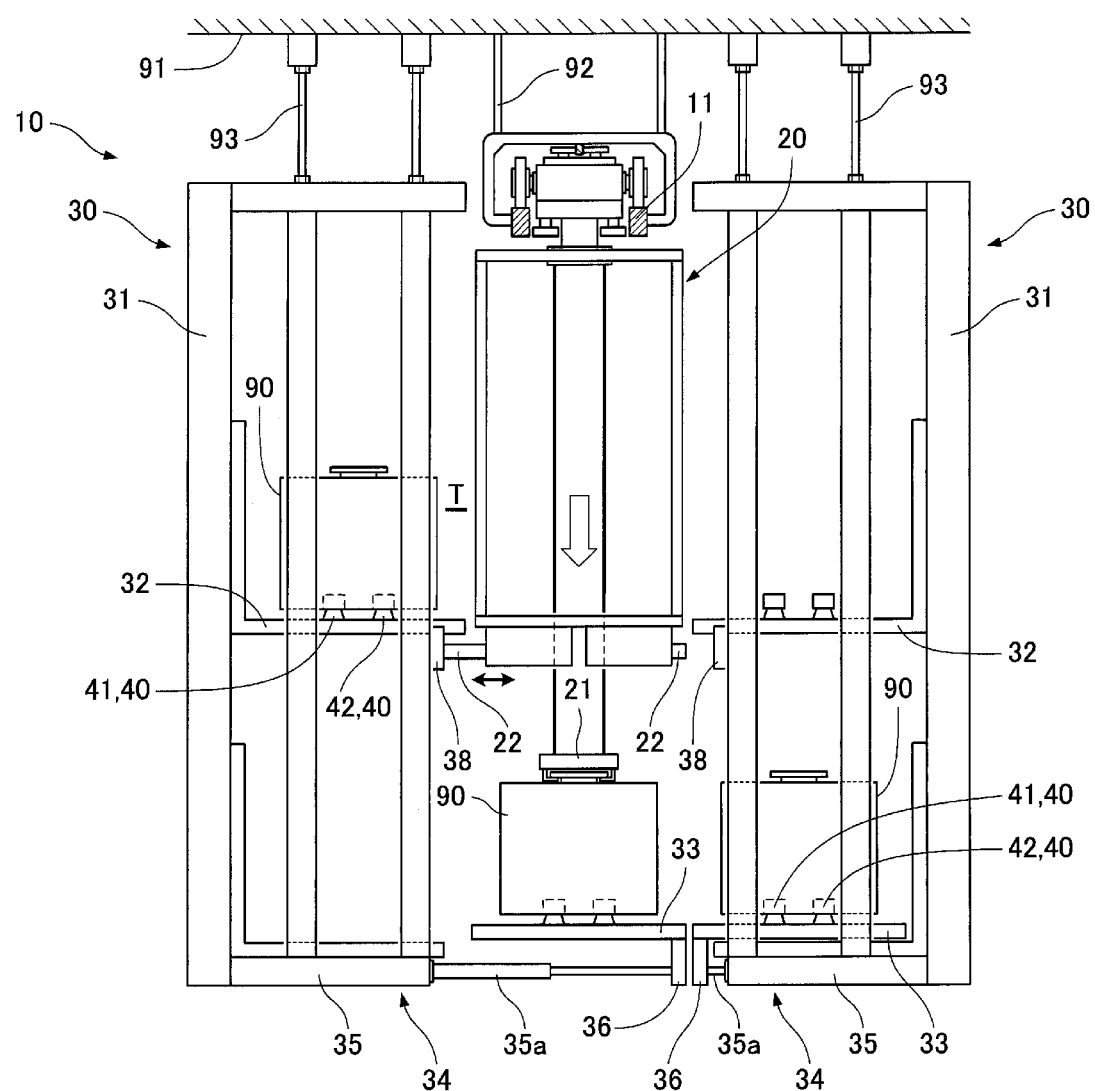
FIG. 2 is a front view in a case where a lower placement portion is horizontally moved in the transfer system.

As shown in FIG. 1 and FIG. 2, the lower placement portion 33 is moved horizontally by driving the drive mechanism 34. The drive mechanism 34 horizontally moves the block 36 to which the lower placement portion 33 is connected, when the rod 35a of the air cylinder 35 is extended or contracted. The air cylinder 35 is driven by the driving air supplied to the regulator 46 of the flow rate controller 43. That is, the flow rate control of the purging gas by the regulator 46, and the horizontal movement of the lower placement portion 33 by the drive mechanism 34 are performed by the driving air supplied to the purging device 40.

The driving air is supplied to the air cylinder 35 via a branch pipe 48 branched from the air pipe 47 of the flow rate controller 43. The branch pipe 48 branched from the air pipe 47 is connected to the air cylinder 35 via an electromagnetic valve 49 or the like. Supply of the driving air to the air cylinder 35 is controlled by operating the electromagnetic valve 49 by the mechanical valve 38.

The mechanical valve 38 is provided on the front surface side of the ceiling storage shelf 30. More specifically, the mechanical valve 38 is provided at a position that is on the front surface side of the ceiling storage shelf 30 and that is lower than the upper placement portion 32, and a position at which the pusher 22 of the ceiling carrier 20 stopped at the transfer position T for the foup 90 can contact the mechanical valve 38, when the pusher 22 horizontally protrudes. The mechanical valve 38 includes a switch to be pressed by the pusher 22 provided in the lower part of the ceiling carrier 20. The mechanical valve 38 turns ON the electromagnetic valve 49, when the switch is pressed by the pusher 22. That is, supply of the driving air to the air cylinder 35 is started by the ceiling carrier 20. By turning ON the electromagnetic valve 49, the driving air from the branch pipe 48 is supplied to the air cylinder 35.

When the ceiling carrier 20 places the foup 90 on the lower placement portion 33, the pusher 22 of the ceiling carrier 20 protrudes horizontally, and presses the mechanical valve 38. That is, the ceiling carrier 20 starts supplying of the driving air to the air cylinder 35. Accordingly, the electromagnetic valve 49 is turned ON, and the driving air from the branch pipe 48 is supplied to the air cylinder 35. Then, when the rod 35a of the air cylinder 35 is extended, the lower placement portion 33 connected to the block 36 moves horizontally to directly below the ceiling carrier 20, and placement of the foup 90 is enabled. The ceiling carrier 20 places the foup 90 on the lower placement portion 33 by lowering the foup 90 with the transfer device 21.

After placing the foup 90 on the lower placement portion 33, the ceiling carrier 20 horizontally contracts the pusher 22 to cancel pressing of the mechanical valve 38. Accordingly, the electromagnetic valve 49 is turned OFF, and supply of the driving air from the branch pipe 48 to the air cylinder 35 is stopped. In the air cylinder 35, the rod 35a is contracted when the driving air is exhausted. Accordingly, the lower placement portion 33 connected to the block 36 horizontal moves to the storage shelf body 31 side, and the foup 90 is housed in the storage shelf body 31.

As described above, in the transfer system 10, the horizontal movement of the lower placement portion 33 with respect to the storage shelf body 31 is performed by the driving air supplied to the purging device 40 (the flow rate controller 43). Thus, it is unnecessary to provide a power supply system for moving the lower placement portion 33. Therefore, the drive mechanism 34 for moving the lower placement portion 33, and the purging device 40 for purging the foup 90 can be installed with a simple system configuration.

In the present embodiment, the lower placement portion 33 is horizontally moved by driving the air cylinder 35 with the driving air for driving the regulator 46 of the flow rate controller 43. However, the gas is not limited to the driving air as long as it is a gas supplied to the purging device 40, and the air cylinder 35 may be driven by the purging gas for purging the foup 90. In this case, the purging gas supplied to the foup 90 is supplied to the air cylinder 35 via a pipe branched from the pipe 45 of the purging device 40. The pipe is connected to the air cylinder 35 via the electromagnetic valve 49 or the like.

In the present embodiment, supply of the driving air to the air cylinder 35 is controlled by the mechanical valve 38 and the pushers 22 of the ceiling carrier 20. However, supply of the driving air to the air cylinder 35 is not limited to this, and may be controlled by communication equipment, such as a sensor provided in the ceiling carrier 20 or the ceiling storage shelf 30. For example, supply of the driving air to the air cylinder 35 may be started to horizontally move the lower placement portion 33, when the ceiling carrier 20 arrives at the transfer position T for the foup 90, and a sensor on the ceiling storage shelf 30 side is turned ON.

Additionally, when supply of the driving air to the air cylinder 35 is controlled by the communication equipment, such as a sensor provided in the ceiling carrier 20 or the like, the lower placement portion 33 can be moved to directly below the transfer position T for the foup 90, in a stage prior to arrival of the ceiling carrier 20 at the transfer position T for the foup 90. Therefore, the foup 90 can be efficiently transferred between the ceiling carrier 20 and the ceiling storage shelf 30 (the lower placement portion 33).

In the present embodiment, only one upper placement portion 32 and one lower placement portion 33 are disposed in the longitudinal direction of the running rail 11. However, disposal of the upper placement portion 32 and the lower placement portion 33 is not limited to this, and a plurality of upper placement portions 32 and a plurality of lower placement portions 33 may be disposed to be arranged in the longitudinal direction of the running rail 11 (for example, three upper placement portions 32 and three lower placement portions 33 may be disposed in the longitudinal direction (transverse direction) of the running rail 11, so as to form the ceiling storage shelf 30 with two stages in the vertical direction and three columns in the transverse direction).

In the present embodiment, the ceiling storage shelf 30 is formed by the two upper and lower placement portions (the upper placement portion 32 and the lower placement portion 33). However, the ceiling storage shelf 30 is not limited to this, and the ceiling storage shelf 30 may be formed by three or more placement portions in the vertical direction, or by one placement portion.

In the present embodiment, only the lower placement portion 33 is horizontally moved. However, the configuration is not limited to this, and only the upper placement portion 32 may be horizontally moved, or both the upper placement portion 32 and the lower placement portion 33 may be horizontally moved.

In the present embodiment, the lower placement portion 33 is horizontally moved. However, as in a transfer system 10A shown in FIG. 3 and FIG. 4, a ceiling storage shelf 30A may be formed by two upper and lower placement portions (an upper placement portion 32A and a lower placement portion 33A), and only the upper placement portion 32A may be moved up and down.

Figure 3:
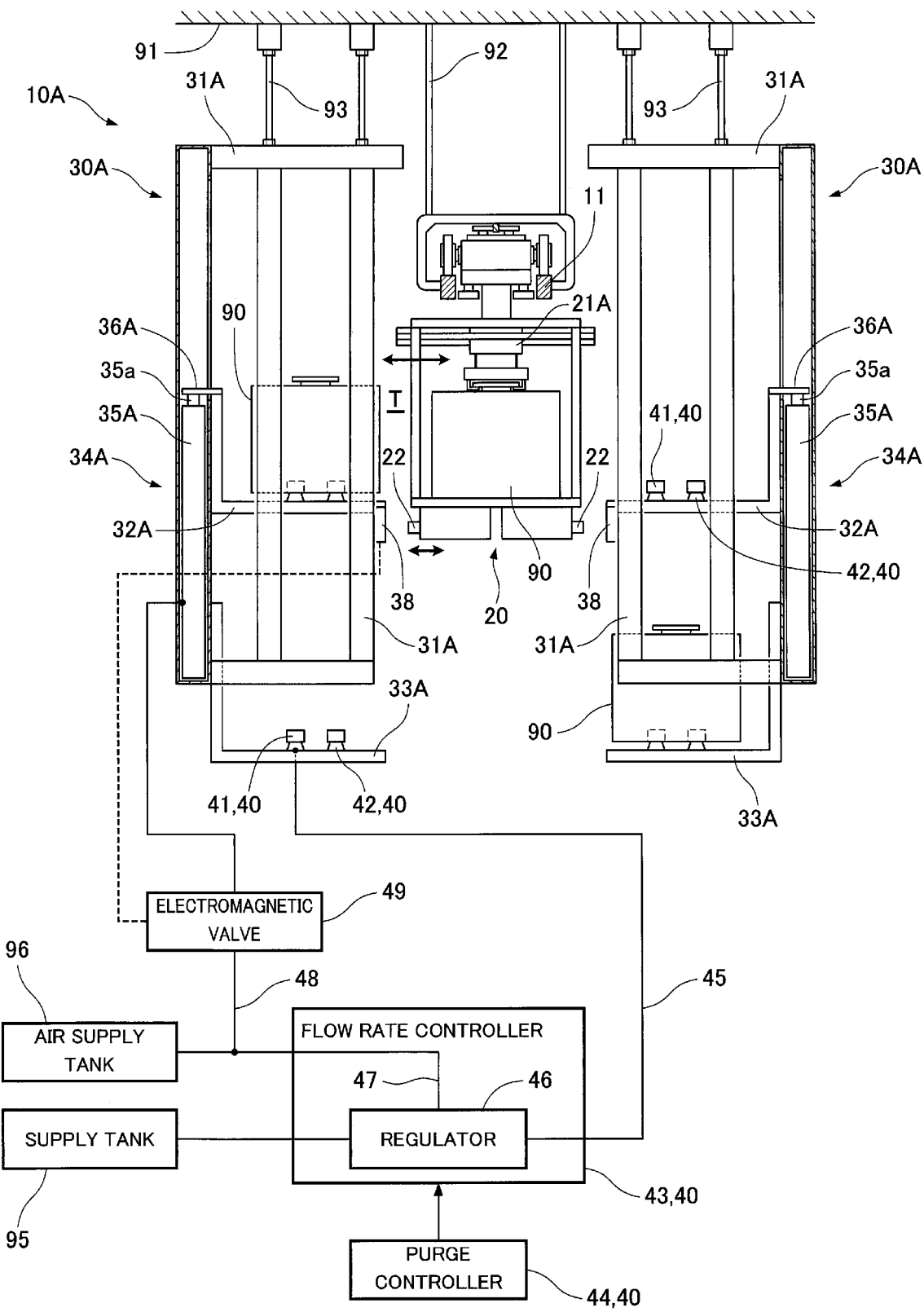
FIG. 3 is a front view of a transfer system according to another embodiment of the present invention.

As shown in FIG. 3, the ceiling storage shelf 30A includes a storage shelf body 31A (an example of "the main body portion of the storage shelf"), a plurality of placement portions 32A and 33A for placing the foup 90 thereon, and a drive mechanism 34A for moving the upper placement portion 32A up and down.

The storage shelf body 31A is a frame that extends in the vertical direction. The storage shelf body 31A is held in a suspended state from the ceiling 91 with the volts 93 or the like. The storage shelf body 31A holds the placement portions 32A and 33A with a predetermined interval in the vertical direction.

The upper placement portion 32A and the lower placement portion 33A are plates on which the foup 90 can be placed. The upper placement portion 32A and the lower placement portion 33A are disposed in the storage shelf body 31A at the predetermined interval in the vertical direction, and two foups 90 can be disposed on the upper and lower portions.

The upper placement portion 32A is a movable receiving rack that can be moved up and down with respect to the storage shelf body 31A. In the ceiling storage shelf 30A, the foup 90 is transferred between the ceiling carrier 20 and the upper placement portion 32A, when the transfer device 21A of the ceiling carrier 20 horizontally moves the foup 90 at the transfer position T for the foup 90. Additionally, the foup 90 is transferred between the ceiling carrier 20 and the lower placement portion 33A, when the transfer device 21A horizontally moves and then lowers the foup 90. Therefore, the upper placement portion 32A is moved up to a position upper than a position to which the transfer device 21A is horizontally moved. The upper placement portion 32A is moved up and down by the drive mechanism 34A.

The lower placement portion 33A is a fixed receiving rack fixed to the storage shelf body 31A.

The drive mechanism 34A extends in the vertical direction on a rear surface side (the opposite side of the side from which the foup 90 is transferred in and out) of the storage shelf body 31A. The drive mechanism 34A is mainly composed of an air cylinder 35A, and a block 36A moved by extension and contraction of the rod 35a of the air cylinder 35. The air cylinder 35A is provided so that the rod 35a can be vertically extended and contracted. The block 36A is connected to the tip of the rod 35a. The block 36A moves vertically when the rod 35a is extended and contracted. The block 36A is connected to the upper placement portion 32A. In the drive mechanism 34A, when the block 36A moves vertically, the upper placement portion 32A is moved up and down with respect to the storage shelf body 31A.

The purging device 40 is disposed below the placement portions 32A and 33A. The purging device 40 purges the foups 90 placed in the placement portions 32A and 33A. The purging device 40 mainly includes the purge nozzle 41, the exhaust nozzle 42, the flow rate controller 43, and the purge controller 44.

Next, up and down movement of the upper placement portion 32A will be described.

As shown in FIG. 3 and FIG. 4, the upper placement portion 32A is moved up and down by the drive mechanism 34A. The drive mechanism 34A moves up the block 36A to which the lower placement portion 33 is connected, when the rod 35a of the air cylinder 35A is expanded and contracted. The air cylinder 35A is driven by the driving air supplied to the regulator 46 of the flow rate controller 43. That is, the flow rate control of the purging gas by the regulator 46, and the up and down movement of the upper placement portion 32A by the drive mechanism 34A are performed by the driving air supplied to the purging device 40.

Supply of the driving air to the air cylinder 35A is controlled by operating the electromagnetic valve 49 with the mechanical valve 38. The mechanical valve 38 turns ON the electromagnetic valve 49, when the switch is pressed by the pusher 22 of the ceiling carrier 20. When the electromagnetic valve 49 is turned ON, the driving air from the branch pipe 48 is supplied to the air cylinder 35A.

When the ceiling carrier 20 places the foup 90 on the upper placement portion 32A, the transfer device 21A transfers the foup 90 to the upper placement portion 32A by horizontally moving the foup 90, without the pusher 22 of the ceiling carrier 20 pressing the mechanical valve 38.

On the other hand, when the ceiling carrier 20 places the foup 90 on the lower placement portion 33A, the pusher 22 of the ceiling carrier 20 horizontally protrude to press the mechanical valve 38. Accordingly, the electromagnetic valve 49 is turned ON, and the driving air is supplied to the air cylinder 35A from the branch pipe 48. Then, when the rod 35a of the air cylinder 35A is extended, the upper placement portion 32A is moved up to a position upper than a position to which the transfer device 21A of the ceiling carrier 20 is horizontally moved. When the upper placement portion 32A is moved up, the transfer device 21A horizontally moves the foup 90 to directly above the lower placement portion 33A, and further, lowers the foup 90 to be placed on the lower placement portion 33A.

After placing the foup 90 on the lower placement portion 33A, the ceiling carrier 20 horizontally contracts the pusher 22 to cancel pressing of the mechanical valve 38. Accordingly, the electromagnetic valve 49 is turned OFF, and supply of the driving air from the branch pipe 48 to the air cylinder 35A is stopped. Accordingly, when the driving air supplied to the air cylinder 35A is exhausted, the rod 35a is contracted, and the upper placement portion 32A connected to the block 36A is lowered.

As described above, in the transfer system 10A, the upper placement portion 32A is moved up with respect to the storage shelf body 31A by the driving air supplied to the purging device 40 (the flow rate controller 43). Thus, it is unnecessary to provide a power supply system for moving the upper placement portion 32A. Therefore, the drive mechanism 34A for moving the upper placement portion 32A, and the purging device 40 for purging the foup 90 can be installed with a simple system configuration.

In the present embodiment, the upper placement portion 32A is moved up and down by driving the air cylinder 35A with the driving air for driving the regulator 46 of the flow rate controller 43. However, the gas is not limited to the driving air as long as it is a gas supplied to the purging device 40, and the air cylinder 35A may be driven by the purging gas for purging the foup 90.

In the present embodiment, supply of the driving air to the air cylinder 35A is controlled by the mechanical valve 38 and the pushers 22 of the ceiling carrier 20. However, supply of the driving air to the air cylinder 35A is not limited to this, and may be controlled by communication equipment, such as a sensor provided in the ceiling carrier 20 or the ceiling storage shelf 30A. Additionally, when supply of the driving air to the air cylinder 35A is controlled by the communication equipment, such as the sensor provided in ceiling carrier 20 or the like, the upper placement portion 32A can be moved up to a predetermined position in a stage prior to arrival of the ceiling carrier 20 at the transfer position T for the foup 90. Thus, the foup 90 can be efficiently transferred between the ceiling carrier 20 and the ceiling storage shelf 30A (the upper placement portion 32A).

In the present embodiment, only one upper placement portion 32A and one lower placement portion 33A are disposed in the longitudinal direction of the running rail 11. However, disposal of the upper placement portion 32A and the lower placement portion 33A is not limited to this, and a plurality of upper placement portions 32A and a plurality of lower placement portions 33A may be disposed to be arranged in the longitudinal direction of the running rail 11.

In the present embodiment, the ceiling storage shelf 30A is formed by the two upper and lower placement portions (the upper placement portion 32A and the lower placement portion 33A). However, the ceiling storage shelf 30A is not limited to this, and the ceiling storage shelf 30A may be formed by three or more placement portions in the vertical direction, or by one placement portion.

In the present embodiment, only the upper placement portion 32A is moved up and down. However, the configuration is not limited to this, and only the lower placement portion 33A may be moved up and down, or both of the placement portions, i.e., the upper placement portion 32A and the lower placement portion 33A, may be moved up and down.

In the transfer systems 10 and 10A of the present embodiment, the carrier transferring the container along the transfer path serves as the ceiling carrier 20. However, the ceiling carrier 20 is not limited to this, and may be a carrier that runs on the ground (whether or not a rail exists does not matter), as long as the carrier transfers the container to the storage shelf for the container.

In the transfer systems 10 and 10A of the present embodiment, the storage shelf storing the container serves as the ceiling storage shelves 30 and 30A. However, the ceiling storage shelves 30 and 30A are not limited to this, and may be a storage shelf installed on the ground, as long as the storage shelf is provided along the transfer path for the carrier.

In the transfer systems 10 and 10A of the present embodiment, the container is purged by introducing the purging gas from the gas inlet port of the foup 90. However, purging is not limited to this, and any configuration may be used as long as the container can be purged with the purging gas.

In the transfer systems 10 and 10A of the present embodiment, the purging device 40 is provided in each of the upper placement portions 32 and 32A and the lower placement portions 33 and 33A. However, provision of the purging device 40 is not limited to this, and the purging device 40 may be provided in either one of the upper placement portions 32 and 32A, and the lower placement portions 33 and 33A. That is, in a storage shelf having a placement portion that purges a container, and a placement portion that does not purge the container, the placement portion that does not purge the container may be configured to be movable by a gas supplied to a purging device.

REFERENCE SIGNS LIST

10, 10A transfer system
11 running rail (transfer path)
20 ceiling carrier (carrier)
30, 30A ceiling storage shelf (storage shelf)
31, 31A storage shelf body (main body portion of storage shelf)
32, 32A upper placement portion (placement portion)
33, 33A lower placement portion (placement portion)
40 purging device
90 foup (container)

What is claimed is:

1. A transfer system comprising:
a carrier transferring a container along a transfer path;
a storage shelf provided along the transfer path and storing the container transferred by the carrier; and
a purging device purging the container stored in the storage shelf,
wherein the storage shelf includes a placement portion for placing the container thereon, and
the placement portion can be moved with respect to a main body portion of the storage shelf by a gas supplied to the purging device.

2. The transfer system according to claim 1, wherein the placement portion can be moved up and down with respect to the main body portion of the storage shelf by the gas supplied to the purging device.

3. The transfer system according to claim 1, wherein the placement portion can be horizontally moved with respect to the main body portion of the storage shelf by the gas supplied to the purging device.

4. The transfer system according to claim 1, wherein the gas supplied to the purging device includes a purging gas for purging the container, and a flow rate controlling gas for adjusting a flow rate of the purging gas, and
the placement portion can be moved with respect to the main body portion of the storage shelf by the purging gas.

5. The transfer system according to claim 1, wherein the gas supplied to the purging device includes a purging gas for purging the container, and a flow rate controlling gas for adjusting a flow rate of the purging gas, and
the placement portion can be moved with respect to the main body portion of the storage shelf by the flow rate controlling gas.

6. The transfer system according to claim 1, comprising:
a drive mechanism for moving the placement portion with respect to the main body portion of the storage shelf,
wherein the placement portion can be moved with respect to the main body portion of the storage shelf, when the gas supplied to the purging device is started to be supplied to the drive mechanism by the carrier.

7. The transfer system according to claim 2, wherein the placement portion can be horizontally moved with respect to the main body portion of the storage shelf by the gas supplied to the purging device.

* * * * *